(12) United States Patent
Hong et al.

(10) Patent No.: US 8,816,365 B2
(45) Date of Patent: Aug. 26, 2014

(54) HYBRID LIGHT EMITTING DIODE CHIP AND LIGHT EMITTING DIODE DEVICE HAVING THE SAME, AND MANUFACTURING METHOD THEREOF

(75) Inventors: Young Gi Hong, Goyang-si (KR); Seung Ho Jang, Goyang-si (KR); Won Ho Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 529 days.

(21) Appl. No.: 12/972,584

(22) Filed: Dec. 20, 2010

(65) Prior Publication Data

US 2011/0204395 A1 Aug. 25, 2011

(30) Foreign Application Priority Data

Feb. 24, 2010 (KR) ........................ 10-2010-0016617

(51) Int. Cl.
*H01L 33/58* (2010.01)

(52) U.S. Cl.
USPC ............. 257/94; 257/79; 257/98; 257/E33.02

(58) Field of Classification Search
USPC ................................................ 257/774, 775
See application file for complete search history.

(56) References Cited

U.S. PATENT DOCUMENTS

| | | | |
|---|---|---|---|
| 6,787,905 B1 * | 9/2004 | Goerlach et al. | 257/751 |
| 2004/0130002 A1 | 7/2004 | Weeks et al. | |
| 2007/0122969 A1 * | 5/2007 | Oh et al. | 438/251 |
| 2008/0237569 A1 | 10/2008 | Nago et al. | |
| 2008/0237614 A1 | 10/2008 | Ishikura et al. | |
| 2010/0012963 A1 | 1/2010 | Hwan | |
| 2010/0237375 A1 * | 9/2010 | Yamazaki et al. | 257/98 |
| 2011/0204395 A1 * | 8/2011 | Hong et al. | 257/94 |
| 2011/0215361 A1 * | 9/2011 | Wang | 257/99 |

FOREIGN PATENT DOCUMENTS

| | | |
|---|---|---|
| CN | 1527410 A | 9/2004 |
| JP | S61-296780 A | 12/1986 |
| JP | 2009-105123 A | 5/2009 |
| WO | 2005/008791 A2 | 1/2005 |
| WO | 2008/053907 A1 | 5/2008 |

OTHER PUBLICATIONS

Office Action issued in counterpart Chinese Patent Application No. 201010605741.4 dated Sep. 18, 2012.
SIPO—Second Office Action for Chinese Patent Application No. 201010605741.4—Issued on Apr. 15, 2013; Including English Translation.

* cited by examiner

*Primary Examiner* — Victor A Mandala
*Assistant Examiner* — William Harriston
(74) *Attorney, Agent, or Firm* — Morgan, Lewis & Bockius LLP

(57) ABSTRACT

Disclosed is a hybrid LED chip: comprising a first clad layer of P-type semiconductor material; a second clad layer of N-type semiconductor material; an active layer between the first and second clad layers; a first bonding metal layer on the first clad layer; a second bonding metal layer on the second clad layer; a ceramic substrate positioned on and bonded to the first and second bonding metal layers, wherein the ceramic substrate includes at least one first via hole to expose the first bonding metal layer, and at least one second via hole to expose the second bonding metal layer; a P-type electrode formed by burying a conductive material in the at least one first via hole; and an N-type electrode formed by burying a conductive material in the at least one second via hole, wherein the first and second via holes in the ceramic substrate are formed in cylindrical shapes, and the circumferential surface of each cylindrical shape is provided with an intaglio pattern.

11 Claims, 7 Drawing Sheets

(a)　　　　　(b)　　　　　(c)

(a)　　　　　(b)　　　　　(c)

HYBRID LIGHT EMITTING DIODE CHIP AND LIGHT EMITTING DIODE DEVICE HAVING THE SAME, AND MANUFACTURING METHOD THEREOF

CROSS REFERENCE TO RELATED APPLICATIONS

This application claims the benefit of the Korean Patent Application No.10-2010-0016617 filed on Feb. 24, 2010, which is hereby incorporated by reference as if fully set forth herein.

BACKGROUND OF THE INVENTION

1. Field of the Invention

The present invention relates to a light emitting diode (LED), and more particularly, to a hybrid LED chip which facilitate to improve an optical efficiency by enhancing a current injection property, and an LED device including the hybrid LED chip. Also, the present invention relates to a method for manufacturing the hybrid LED chip, which facilitates to improve a manufacturing efficiency by omitting a wire bonding process.

2. Discussion of the Related Art

A light emitting diode (LED) is widely used in various fields owing to advantageous properties of low power consumption and long lifespan. Especially, a white-color LED device is recently applied to an illumination device, and a backlight for a display device.

FIG. 1 illustrates a related art LED device.

Referring to FIG. 1, the related art LED device comprises an LED chip 10 for generating light with a specific wavelength; a fluorescent layer 50 for converting the light generated in the LED chip 10 into specific colored light; a lead electrode 30 for supplying a driving power source to the LED chip 10; a bonding wire (generally, gold wire) 20 for electrically connecting the LED chip 10 and the lead electrode 30 with each other; a lead frame 40 for mounting the LED chip 10, the fluorescent layer 50, and the lead electrode 30 thereon; and a lens 60 on the fluorescent layer 50.

For improvement of optical efficiency in the LED device, various conditions have to be considered. Among the things considered to be important is optical efficiency of the LED chip 10 for generating the light.

The LED chip 10 may be largely classified into a lateral type and a vertical type.

FIG. 2 illustrates a related art lateral type LED chip; and FIG. 3 illustrates a related art vertical type LED chip.

As shown in FIG. 2, the related art lateral type LED chip comprises an n-type first clad layer (n-GaN) of n-GaN material on a sapphire substrate or silicon (SiC) substrate; a multiple quantum well layer (MQW layer); a p-type second clad layer (p-GaN) of p-GaN material; a bonding metal layer for bonding of P-type electrode; and the P-type electrode. At one side of the first clad layer, there are the MQW layer, second clad layer, bonding metal layer, and P-type electrode which are sequentially formed on the first clad layer.

At the other side of the first clad layer, a bonding metal layer for bonding of N-type electrode and the N-type electrode are sequentially formed on the first clad layer.

FIG. 2 illustrates that the n-type first clad layer (n-GaN), the MQW layer, and the p-type second clad layer (p-GaN) are sequentially formed on the sapphire substrate.

Like the aforementioned lateral type LED chip, the related art vertical type LED chip comprises an n-type first clad layer (n-GaN) of n-GaN material, a multiple quantum well layer (MQW layer), and a p-type second clad layer (p-GaN) of p-GaN material, which are sequentially formed on a sapphire substrate or silicon (SiC) substrate.

The vertical type LED chip is different from the lateral type LED chip of FIG. 2 in that the vertical type LED chip includes P-type electrode and N-type electrode provided in a vertical structure. FIG. 3 illustrates that the n-type first clad layer (n-GaN), the MQW layer, and the p-type second clad layer (p-GaN) are sequentially formed on the sapphire substrate.

In the related art lateral type LED chip and vertical type LED chip, the P-type electrode and N-type electrode are electrically connected with the lead electrode 30 of FIG. 1 through the bonding wire 20, whereby the driving power source is applied to the P-type electrode and N-type electrode.

Thus, the bonding wire 20 is essential for driving of the LED device. That is, it is disadvantageous in that the process for forming the bonding wire 20 is necessarily carried out for the manufacturing process.

The bonding wire 20 having a fine line-width may cause the deterioration of current injection property to the LED chip 10, and simultaneously the defective connection between the bonding wire 20 and the lead electrode 30.

If the defects occur due to the connection of the bonding wire 20, the LED device cannot emit the light, whereby reliability and quality of the LED device is lowered.

Also, since the aforementioned lateral type LED device includes the P-type electrode and N-type electrode provided in a horizontal direction, a current flowing in the horizontal direction from the N-type electrode to the P-type electrode via the MQW layer becomes narrow, to thereby cause the deterioration of optical efficiency.

Also, the aforementioned lateral type LED device has a problem of low heat dissipation due to its structural property, whereby reliability and quality of the LED device is lowered.

SUMMARY OF THE INVENTION

Accordingly, the present invention is directed to a hybrid LED chip and a method for manufacturing the same, and an LED device having the hybrid LED chip that substantially obviate one or more problems due to limitations and disadvantages of the related art.

An advantage of the present invention is to provide a hybrid LED chip which facilitates to improve an optical efficiency by enhancing a current injection property.

Another advantage of the present invention is to provide a hybrid LED chip which is capable of supplying a driving power source to an electrode without using a bonding wire.

Another advantage of the present invention is to provide a hybrid LED chip and an LED device including the same, which facilitates to improve reliability of the LED device by enhancing a heat dissipation property.

A further advantage of the present invention is to provide a method for manufacturing a hybrid LED chip, which facilitates to improve a manufacturing efficiency by omitting a wire bonding process.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a hybrid LED chip comprising: a first clad layer of P-type semiconductor material; a second clad layer of N-type semiconductor material; an active layer between the first and second clad layers; a first bonding metal layer on the first clad layer; a second bonding metal layer on the second clad layer; a ceramic substrate positioned on and bonded to the first and second bonding metal layers, wherein the ceramic substrate includes at least one first via hole to expose the first bonding metal layer, and at least one second via hole to expose the second bonding metal layer; a P-type electrode formed by burying a conductive material in the at least one first via hole; and an N-type electrode formed by burying a conductive material in the at least one second via hole, wherein the first and second via holes in the ceramic substrate are formed in cylindrical shapes, and the circumferential surface of each cylindrical shape is provided with an intaglio pattern.

Each of the P-type electrode and N-type electrode is formed to have a relief pattern corresponding to the intaglio pattern in each of the first and second via holes.

The P-type electrode and N-type electrode are formed in cylindrical shapes, and the circumferential surface of each cylindrical shape is provided with a relief pattern having the plurality of triangular-shaped cross sections, trapezoidal-shaped cross sections, saw-tooth shaped cross sections, or elliptical-shaped cross sections at one side of the circumferential surface.

In another aspect of the present invention, there is provided a method for manufacturing a hybrid LED chip comprising: forming sequentially an N-type semiconductor layer, an active layer, and a P-type semiconductor layer on a base substrate, and then forming a reflective layer by depositing a light-reflecting conductive material on a predetermined portion of the P-type semiconductor layer; forming a trench for exposing the upper surface of the N-type semiconductor layer by etching the N-type semiconductor layer, the active layer, and the P-type semiconductor layer formed on the base substrate at a predetermined depth, and then forming an electrode pad on the N-type semiconductor layer; forming a first bonding metal layer on the reflective layer, and simultaneously a second bonding metal layer on the electrode pad by depositing a conductive material in the reflective layer and trench, and patterning the deposited conductive material; bonding a ceramic substrate onto the first and second bonding metal layers, wherein the ceramic substrate includes at least one first via hole to expose the first bonding metal layer, and at least one second via hole to expose the second bonding metal layer; and forming a P-type electrode being in contact with the first bonding metal layer, and an N-type electrode being in contact with the second bonding metal layer by burying a conductive material in the at least one first via hole and at least one second via hole.

In addition, the method comprises forming an intaglio pattern to increase the surface area of the inner wall in each of the at least one first via hole and at least one second via hole.

At this time, the intaglio pattern is repeatedly formed along the circumference in each of the first and second via holes, and the length of each intaglio pattern is arranged in a longitudinal direction in each of the first and second via holes; and the intaglio pattern is formed with the plurality of triangular-shaped cross sections, trapezoidal-shaped cross sections, saw-tooth shaped cross sections, or elliptical-shaped cross sections at one side of the circumference.

Each of the P-type electrode and N-type electrode is formed to have a relief pattern corresponding to the intaglio pattern in each of the first and second via holes.

The P-type electrode and N-type electrode are formed in cylindrical shapes, and the circumferential surface of each cylindrical shape is provided with a relief pattern having the plurality of triangular-shaped cross sections trapezoidal-shaped cross sections saw-tooth shaped cross sections or elliptical-shaped cross sections at one side of the circumferential surface.

Also, the number of P-type electrodes corresponds to the number of at least one first via hole, and the number of N-type electrodes corresponds to the number of at least one second via hole.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, a hybrid light emitting diode (LED) chip according to the embodiment of the present invention, a method for manufacturing the same, and an LED device having the same will be described with reference to the accompanying drawings.

For the following description of the embodiment of the present invention, if a first structure is described as being formed "on" or "under" a second structure, the first and second structures may come in contact with each other, or there may be a third structure interposed between the first and second structures. Also, the term "on", "under" or "below" is to describe the structure of the present invention based on the following drawings. Thus, the term "on", "under" or "below" used for explaining the manufacturing process of the present invention may be different from the term "on", "under" or "below" used for explaining the completely-manufactured structure of the present invention.

1. Hybrid Led Chip

Figure 1:
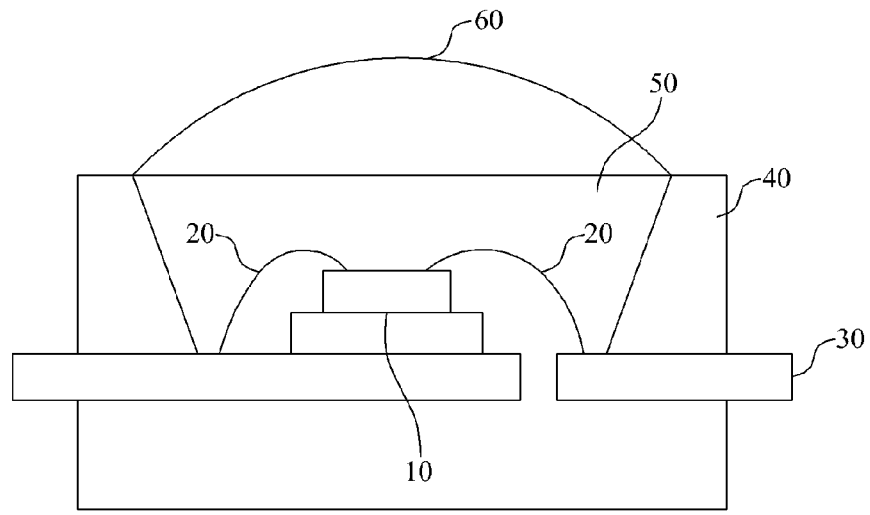
FIG. 1 illustrates a related art LED device.
Figure 2:
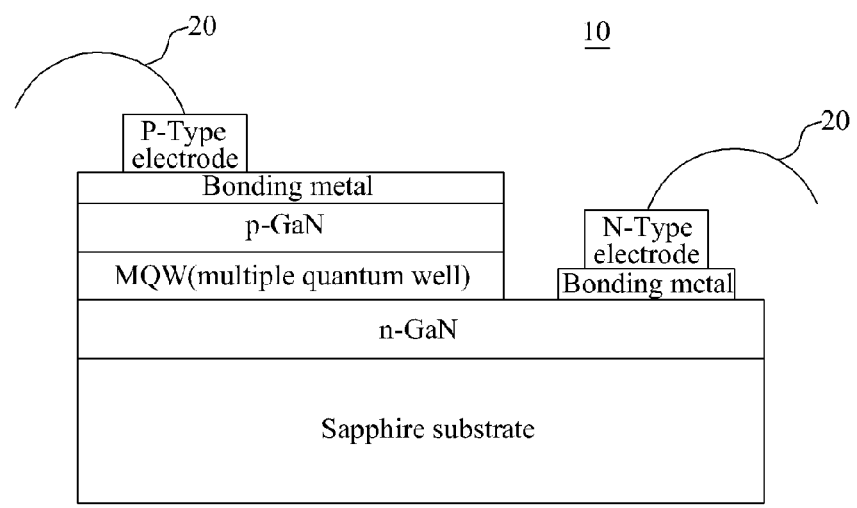
FIG. 2 illustrates a related art lateral type LED chip.
Figure 3:
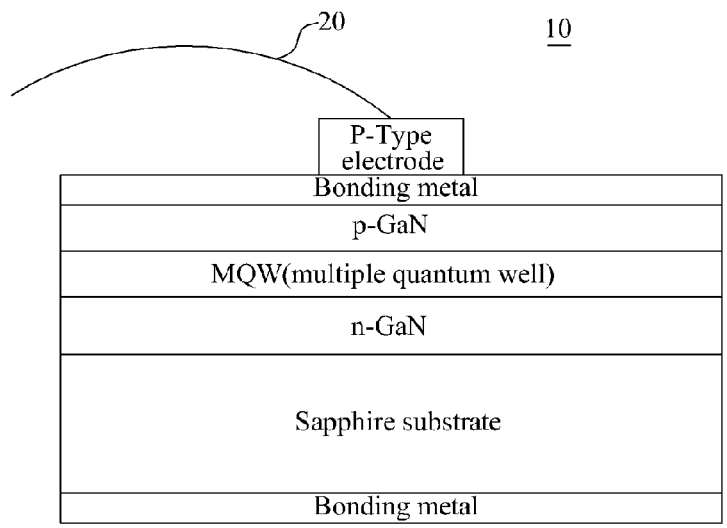
FIG. 3 illustrates a related art vertical type LED chip.
Figure 4:
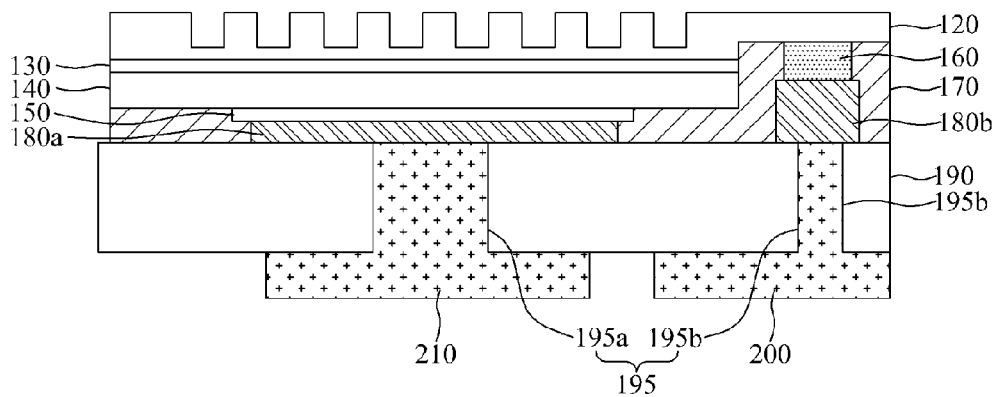
FIG. 4 illustrates a hybrid LED chip according to the embodiment of the present invention.
Figure 5:
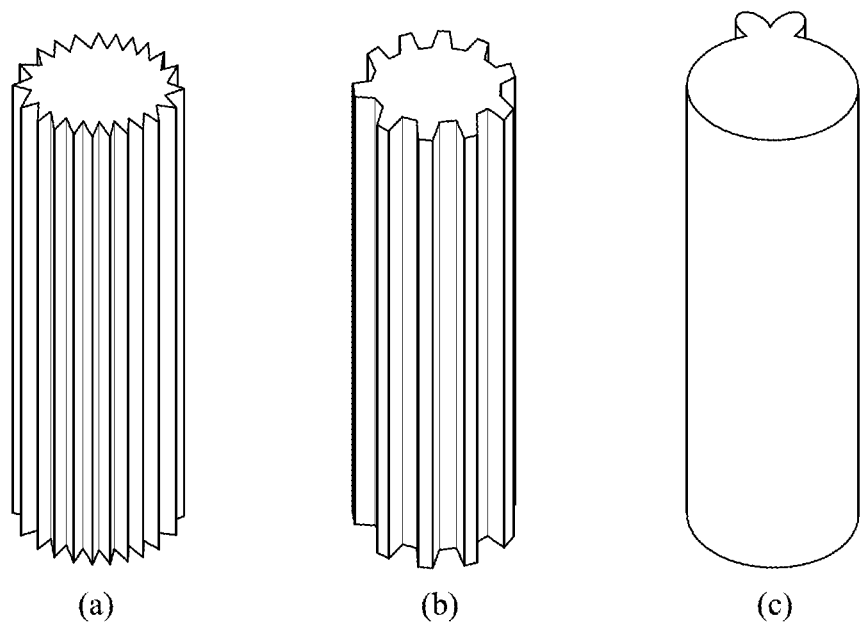
FIG. 5 is a plan view illustrating various shapes of via holes in a ceramic substrate of the hybrid LED chip according to the embodiment of the present invention.
Figure 6:
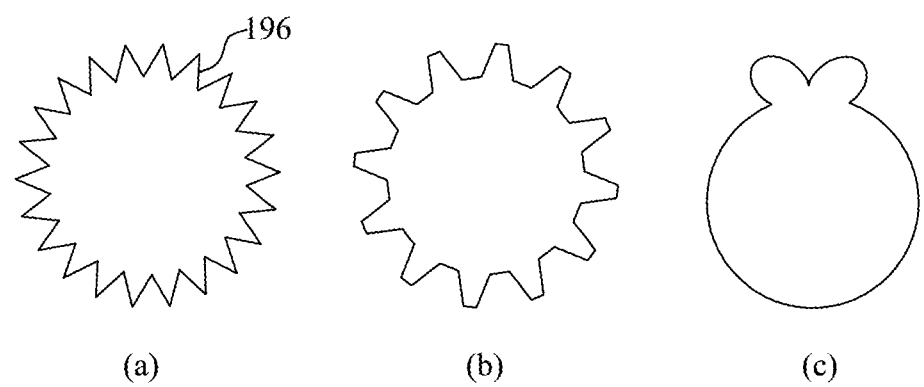
FIG. 6 is a perspective view illustrating P-type electrode and N-type electrode in the hybrid LED chip according to the embodiment of the present invention.

FIG. 4 illustrates a hybrid LED chip according to the embodiment of the present invention. FIG. 5 is a plan view illustrating various shapes of via holes in a ceramic substrate of the hybrid LED chip according to the embodiment of the present invention. FIG. 6 is a perspective view illustrating P-type electrode and N-type electrode in the hybrid LED chip according to the embodiment of the present invention.

Referring to FIGS. 4 to 6, the hybrid LED chip according to the embodiment of the present invention includes a first clad layer 140, an active layer 130 (MQW: Multiple Quantum Well layer), a second clad layer 120, a reflective layer 150, an N-type electrode pad 160, a first bonding metal layer 180a, a second bonding metal layer 180b, an insulating layer 170, a ceramic substrate 190 with a plurality of via holes 195a and 195b, an N-type electrode 200, and a P-type electrode 210.

The first clad layer 140 is a p-type semiconductor layer of p-type material. For example, the first clad layer 140 may be formed by doping GaN, AlGaN, InGaN, MN, or AlInGaN with impurities such as Mg, Zn, or Be.

The second clad layer 120 is an n-type semiconductor layer of n-type material. For example, the second clad layer 120 may be formed by doping GaN, AlGaN, InGaN, MN, or AlInGaN with impurities such as Si, Ge, Sn, Se, or Te.

When the second clad layer 120 is formed on a sapphire substrate, an upper surface of the second clad layer 120 is flat. For the manufacturing process, a surface roughness process may be applied to the upper surface of the second clad layer 120, to thereby make the second clad layer 120 with the uneven upper surface.

The MQW layer 130 is formed between the first clad layer 140 and the second clad layer 120.

The MQW layer 130 emits light in response to an applied current. The MQW layer 130 is formed in a multiple quantum well structure, which is obtained by growing a barrier layer of (Al)GaN layer under such circumstances that a well is formed of In GaN layer.

A color of the light generated by the LED chip may vary according to the material for the MQW layer 130. For example, if the MQW layer 130 has a multiple quantum well structure of InGaN/GaN, the MQW layer 130 emits blue-colored light. Meanwhile, if the MQW layer 130 has a multiple quantum well structure of GaN/AlGaN, InAlGaN/InAlGaN, or InGaN/AlGaN, the MQW layer 130 emits ultraviolet rays.

In this case, a light wavelength can be controlled by changing a component of Indium(In) or Aluminum(Al) in the MQW layer 130; or an optical efficiency of the MQW layer 130 can be improved by changing a depth of the quantum well in the MQW layer 130, the number of layers included in the MQW layer 130, and a thickness of layer included in the MQW layer 130.

The aforementioned first clad layer 140, MQW layer 130, and second clad layer 120 are sequentially formed on the sapphire substrate (not shown).

At this time, the sapphire substrate is removed after forming the first clad layer 140, the MQW layer 130, and the second clad layer 120 during the manufacturing process of the LED chip. Thus, the sapphire substrate does not exist in the completely-manufactured LED chip. In this respect, the sapphire substrate is not shown in FIG. 4.

The reflective layer 150 is formed on the first clad layer 140, wherein the reflective layer 150 is made of a conductive material capable of reflecting the light. The reflective layer 150 reflects the light so that the advancing direction of the light is changed from the P-type electrode 210 toward a light-exiting surface, whereby the optical efficiency is improved. Under the reflective layer 150, there is the first bonding metal layer 180a to connect the first clad layer 140 with the P-type electrode 210.

A trench is formed at one side of the second clad layer 120, and the surface of the second clad layer 120 is exposed through the trench. Then, a conductive material is deposited in the trench so that the N-type electrode pad 160 is formed so as to connect the second clad layer 120 with the N-type electrode 200.

At this time, the N-type electrode pad 160 is formed to be in contact with the surface of the n-type second clad layer 120.

In this case, the outer wall of the MQW layer 130 and the outer wall of the p-type first clad layer 140 are exposed through the trench for exposing the surface of the second clad layer 120. The exposed MQW layer 130 and p-type first clad layer 140 are isolated by the insulating layer 170.

The second bonding metal layer 180b is formed under the N-type electrode pad 160, wherein the second bonding metal layer 180b connects the second clad layer 120 with the N-type electrode 200. The insulating layer 170 is formed between the first bonding metal layer 180a and second bonding metal layer 180b, and is also formed in the trench, to thereby insulate the first bonding metal layer 180a and the second bonding metal layer 180b from each other.

The ceramic substrate 190 is formed of MN material, and is provided with the plural via holes 195. After separately manufacturing the ceramic substrate 190 with the plural via holes 195, the manufactured ceramic substrate 190 is bonded to the entire surface of the first bonding metal layer 180a, second bonding metal layer 180b, and insulating layer 170. At this time, the ceramic substrate 190 may dissipate the heat generated inside the LED chip.

The plural via holes 195 comprise at least one first via hole 195a which exposes the first bonding metal layer 180a to form the P-type electrode 210, and at least one second via hole 195b which exposes the second bonding metal layer 180b to form the N-type electrode 200.

As shown in FIG. 5, each of the first and second via holes 195a and 195b is formed in a circular shape, and more particularly, a cylinder shape whose circumferential surface is provided with an intaglio pattern 196.

The intaglio pattern 196 enables to increase the surface area of the first and second via holes 195a and 195b. As the conductive material is buried in the first and second via holes 195a and 195b with the intaglio pattern 196, the P-type electrode 210 and N-type electrode 200 may be formed as any one of various shapes shown in FIG. 6.

For this, the intaglio pattern 196 may be repeatedly formed along the circumferential surface of each of the first and second via holes 195a and 195b, wherein the length of each intaglio pattern 196 is arranged in the longitudinal direction of the first and second via holes 195a and 195b.

As shown in FIG. 5, the intaglio pattern 196 may be formed with the plurality of triangular-shaped cross section (a), trapezoidal-shaped cross section (b), or saw-tooth shaped cross section.

Also, the intaglio pattern 196 may be formed with the elliptical-shaped cross sections (c) at one side of the circumferential surface along the longitudinal direction of each of the first and second via holes 195a and 195b.

At this time, the intaglio pattern 196 is not limited to the aforementioned shape. That is, the intaglio pattern 196 may be formed in various shapes capable of increasing the inner surface area of the first and second via holes 195a and 195b.

The P-type electrode 210 is formed by burying the conductive material in the at least one first via hole 195a to expose the first bonding metal layer 180a. Thus, the number of P-type electrodes 210 corresponds to the number of first via holes 195a, that is, at least one P-type electrode 210 may be provided.

The N-type electrode 200 is formed by burying the conductive material in the at least one second via hole 195b to expose the second bonding metal layer 180b. Thus, the number of N-type electrodes 200 corresponds to the number of second via holes 195b, that is, at least one N-type electrode 200 may be provided.

Since the P-type electrode 210 and N-type electrode 200 are formed by burying the conductive material in the first and second via holes 195a and 195b with the aforementioned intaglio pattern 196, each of the P-type electrode 210 and N-type electrode 200 has a relief pattern corresponding to the intaglio pattern 196.

In the aforementioned LED chip according to the embodiment of the present invention, the P-type electrode 210 and N-type electrode 200 are formed by burying the conductive material in the at least one first via hole 195a and second via hole 195b formed in the ceramic substrate 190, to thereby increase the surface area of the P-type electrode 210 and N-type electrode 200.

At this time, the N-type electrode 200 and P-type electrode 210 may be formed of any one of Ti, Cr, Al, Cu, Au, or alloy including at least one of Ti, Cr, Al, Cu, or Au.

If the P-type electrode 210 and N-type electrode 200 are formed by burying the conductive material in the first and second via holes 195a and 195b with the intaglio pattern 196, as shown in FIG. 6, the P-type electrode 210 and N-type electrode 200 are respectively formed in the shapes corresponding to the first and second via holes 195a and 195b.

That is, each of the P-type electrode 210 and N-type electrode 200 may be formed in the cylinder shape whose circumferential surface is provided with the relief pattern having the plurality of triangular-shaped cross sections, saw-tooth shaped cross sections, or elliptical-shaped cross sections at one side of the circumferential surface.

The increased surface area of the P-type electrode 210 and N-type electrode 200 enables to improve a current injection property of the LED chip.

The hybrid LED chip having the aforementioned structure according to the embodiment of the present invention is manufactured by a semiconductor manufacturing process, whereby the plurality of hybrid LED chips are manufactured at the same time.

After cutting the completely-manufactured hybrid LED chips, the respective LED chips are mounted on a substrate in a package type through a surface mount device (SMD) technology, to thereby realize an LED device.

According to another embodiment of the present invention, the LED chips are coated with fluorescent material and epoxy without cutting the respective hybrid LED chips, and microlens is formed thereon, to thereby realize an LED device.

The hybrid LED chip with the aforementioned structure according to the embodiment of the present invention enables to supply a driving power source without using a bonding wire, so that it is possible to prevent the device reliability and quality from being deteriorated by the defective connection of bonding wire.

Also, the hybrid LED chip according to the embodiment of the present invention and the LED device including the same facilitate to dissipate the heat generated in the LED chip through the use of second clad layer 120 with the uneven surface, to thereby improve the reliability of the LED device.

2. Method for Manufacturing Hybrid Led Chip

Hereinafter, a method for manufacturing the hybrid LED chip according to the embodiment of the present invention and the LED device including the hybrid LED chip will be described with reference to FIGS. 7 to 14.

FIGS. 7 to 14 illustrate the method for manufacturing the hybrid LED chip according to the embodiment of the present invention, and the LED device including the hybrid LED chip.

Figure 7:
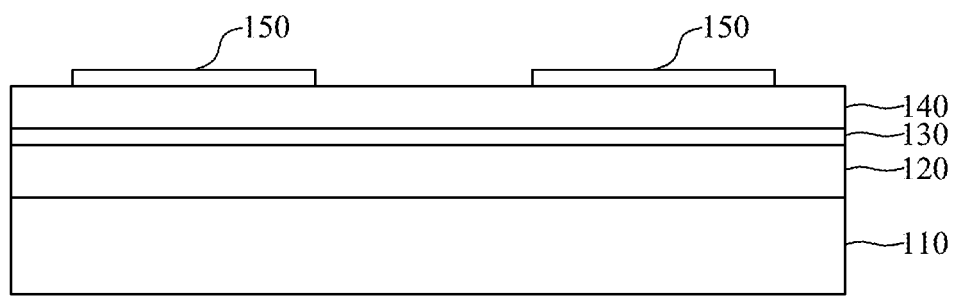
FIGS. 7 to 14 is a series of cross section views illustrating a method for manufacturing the hybrid LED chip according to the embodiment of the present invention.

As shown in FIG. 7, the second clad layer 120, the MQW layer 130, and the first clad layer 140 are sequentially formed on the sapphire substrate 110. Then, the reflective layer 150 is formed by depositing the conductive material capable of reflecting the light on a predetermined portion of the first clad layer 140.

At this time, the second clad layer 120 is the n-type semiconductor layer of n-type material. For example, the second clad layer 120 may be formed by doping GaN, AlGaN, InGaN, MN, or AlInGaN with impurities such as Si, Ge, Sn, Se, or Te.

Also, the first clad layer 140 is the p-type semiconductor layer of p-type material. For example, the first clad layer 140 may be formed by doping GaN, AlGaN, InGaN, MN, or AlInGaN with impurities such as Mg, Zn, or Be.

The first and second clad layers 140 and 120 may be formed through a deposition process, for example, Metal Organic Chemical Vapor Deposition (MOCVD), Molecular Beam Epitaxy (MBE), or Hydride Vapor Phase Epitaxy (HVPE).

The MQW layer 130 is formed between the first and second clad layers 140 and 120, wherein the MQW layer 130 emits the light through the use of current applied. The MQW layer 130 is formed in the multiple quantum well structure, which is obtained by growing the barrier layer of (Al)GaN layer under such circumstances that the well is formed of In GaN layer.

If the MQW layer 130 has the multiple quantum well structure of InGaN/GaN, the MQW layer 130 emits the blue-colored light. Meanwhile, if the MQW layer 130 has the multiple quantum well structure of GaN/AlGaN, InAlGaN/InAlGaN, or InGaN/AlGaN, the MQW layer 130 emits the ultraviolet rays.

Figure 8:
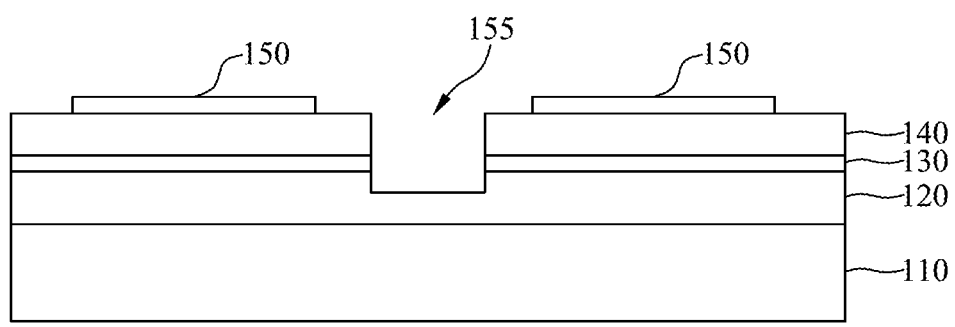

As shown in FIG. 8, predetermined portions of the second clad layer 120, MQW layer 130, and first clad layer 140 sequentially formed on the sapphire substrate 110 are etched at a predetermined depth, to thereby form the trench 155 for exposing the upper surface of the second clad layer 120.

Figure 9:
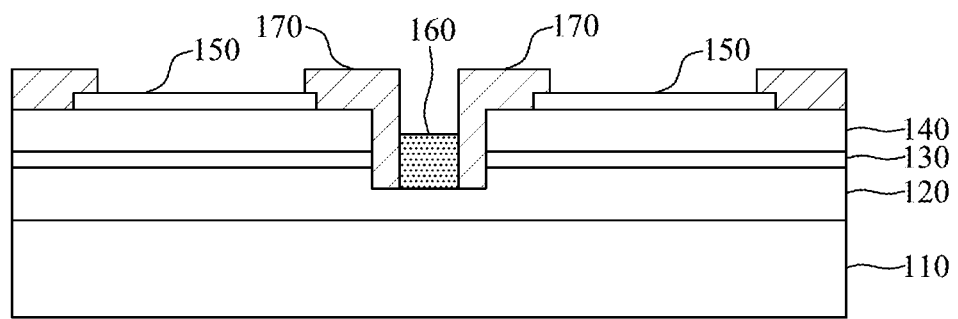

Then, as shown in FIG. 9, the entire surface of the sapphire substrate 110 is doped with an insulating material, and then the doped insulating material is patterned to form the insulating layer 170.

The insulating layer 170 is formed to expose the reflective layer 150 and the surface of the second clad layer 120 exposed by the trench 155. That is, the insulating layer 170 is formed on a predetermined portion of the upper surface of the first clad layer 140, on which the reflective layer 150 is not formed. Also, the insulating layer 170 covers the sidewalls of the second clad layer 120, MQW layer 130, and first clad layer 140 exposed by the trench 155.

Then, the conductive material is deposited in the trench 155 electrically isolated by the insulating layer 170, to thereby form the N-type electrode pad 160 which electrically connects the second clad layer 120 with the following N-type electrode 200 to be explained.

At this time, the N-type electrode pad 160 is formed to be in contact with the n-type second clad layer 120. Also, the N-type electrode pad 160 is isolated from the outer walls of the MQW 130 and p-type second clad layer 120, which are exposed by the trench 155, by the insulating layer 170.

Figure 10:
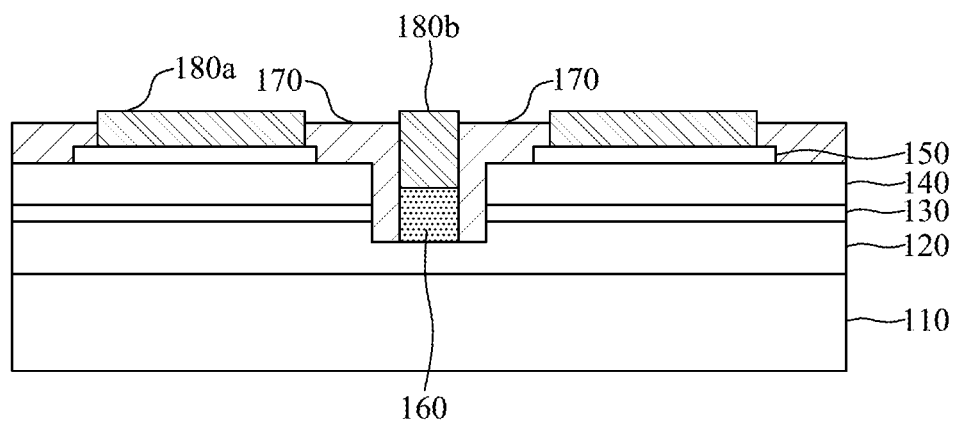

As shown in FIG. 10, the conductive material is deposited on the entire surface of the first clad layer 140, and is then patterned, so that the first bonding metal layer 0180a is formed on a predetermined portion of the reflective layer 150, and more particularly, the predetermined portion on which the insulating layer 170 is not formed. At this time, the first bonding metal layer 180*a* connects the first clad layer 140 with the following P-type electrode 210 to be explained.

The conductive material is deposited in the trench 155, whereby the second bonding metal layer 180*b* is formed on the N-type electrode pad 160. At this time, the second bonding metal layer 180*b* connects the second clad layer 120 with the following N-type electrode 200 to be explained.

Figure 11:
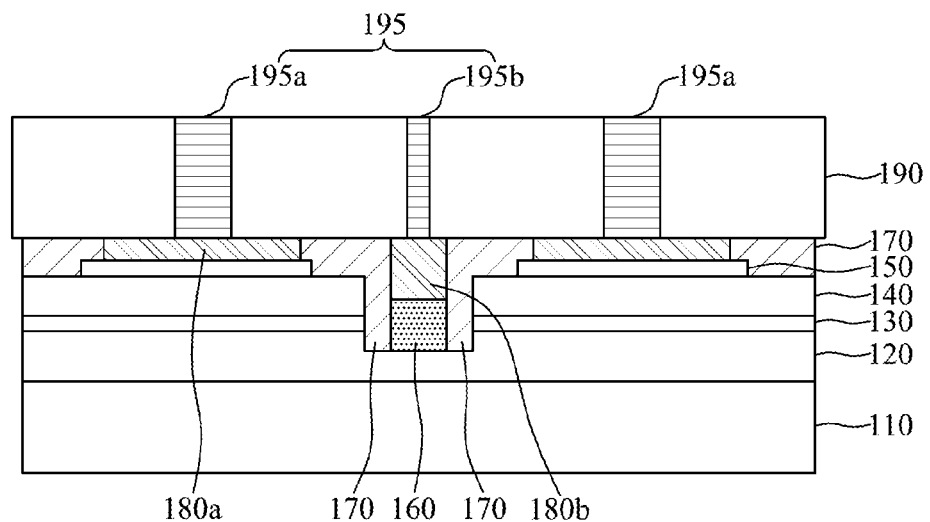

As shown in FIG. 11, the separately-manufactured ceramic substrate 190 with the plurality of via holes 195 is bonded to the insulating layer 170, first bonding metal layer 180*a*, and second bonding metal layer 180*b*; wherein the ceramic substrate 190 is positioned on the insulating layer 170, first bonding metal layer 180*a*, and second bonding metal layer 180*b*.

At this time, the ceramic substrate 190 is formed of MN material. At this time, the ceramic substrate 190 dissipates the heat generated in the LED chip.

The plurality of via holes 195 formed in the ceramic substrate 190 comprise at least one first via hole 195*a* which exposes the first bonding metal layer 180*a* to form the P-type electrode 210; and at least one second via hole 195*b* which exposes the second bonding metal layer 180*b* to form the N-type electrode 200.

Referring to FIG. 5, each of the first and second via holes 195*a* and 195*b* is formed with the intaglio pattern 196 so as to increase the surface area of the P-type electrode 210 and N-type electrode 200 formed by burying a metal material.

For this, the intaglio pattern 196 may be repeatedly formed along the circumferential surface of each of the first and second via holes 195*a* and 195*b*, wherein the length of each intaglio pattern 196 is arranged in the longitudinal direction of the first and second via holes 195*a* and 195*b*.

As shown in FIG. 5, the intaglio pattern 196 may be formed with the plurality of triangular-shaped cross sections (a), trapezoidal-shaped cross sections (b), or saw-tooth shaped cross sections.

Also, the intaglio pattern 196 may be formed with the elliptical-shaped cross sections (c) at one side of the circumferential surface along the longitudinal direction of each of the first and second via holes 195*a* and 195*b*.

At this time, the intaglio pattern 196 is not limited to the aforementioned shape. That is, the intaglio pattern 196 may be formed in various shapes capable of increasing the inner surface area of the first and second via holes 195*a* and 195*b*.

Figure 12:
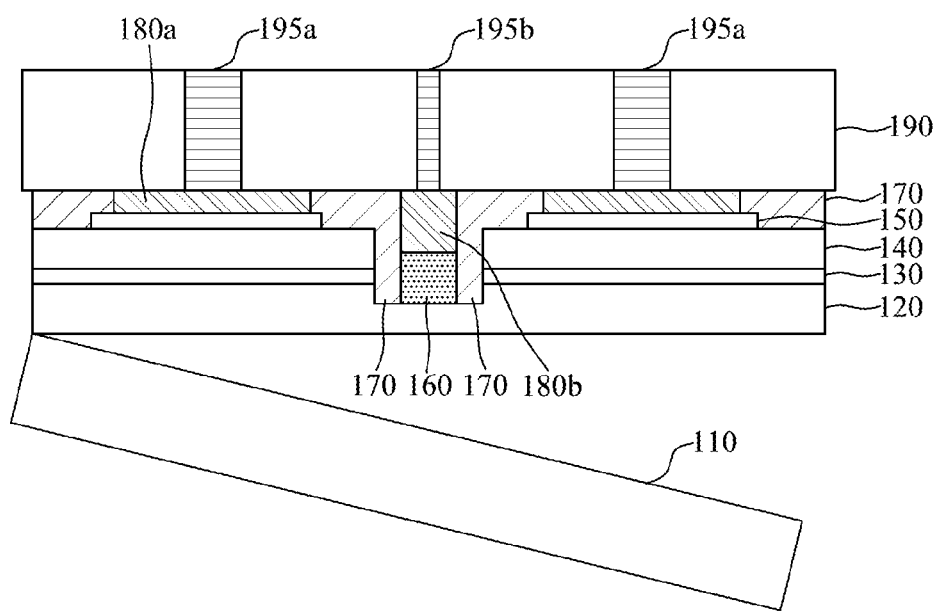

As shown in FIG. 12, the sapphire substrate 110 is separated from the second clad layer 120, and then the separated sapphire substrate is removed.

Figure 13:
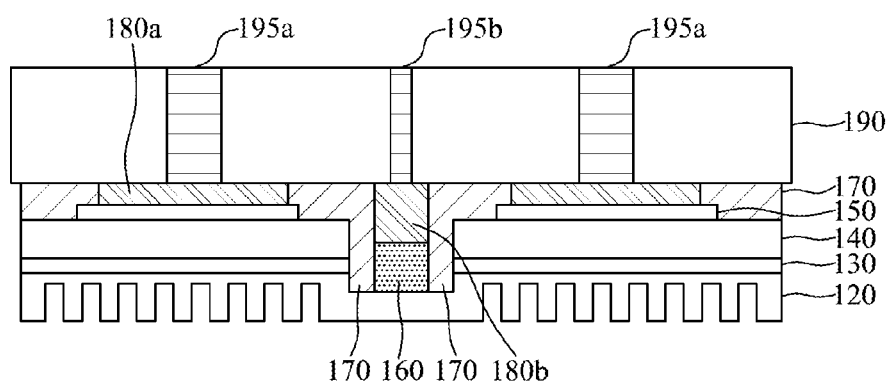

As shown in FIG. 13, the surface-roughness process is applied to the surface of the second clad layer 120 so that the upper surface of the second clad layer 120, from which the sapphire substrate 110 is removed, becomes uneven.

Figure 14:
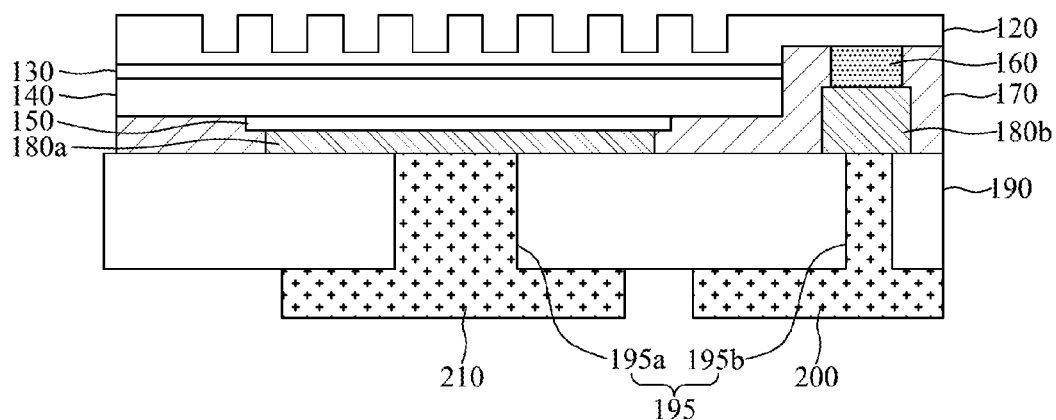

As shown in FIG. 14, the conductive material is buried in the first and second via holes 195*a* and 195*b* with the intaglio pattern 196, whereby the P-type electrode 210 and N-type electrode 200 may be formed as any one of various shapes shown in FIG. 6.

The LED chip according to the embodiment of the present invention is manufactured through the aforementioned steps.

At this time, the N-type electrode 200 and P-type electrode 210 may be formed of any one of Ti, Cr, Al, Cu, Au, or alloy including at least one of Ti, Cr, Al, Cu, or Au.

The P-type electrode 210 is formed by burying the conductive material in the at least one first via hole 195*a* to expose the first bonding metal layer 180*a*. Thus, the number of P-type electrodes 210 corresponds to the number of first via holes 195*a*, that is, at least one P-type electrode 210 may be provided.

Also, the N-type electrode 200 is formed by burying the conductive material in the at least one second via hole 195*b* to expose the second bonding metal layer 180*b*. Thus, the number of N-type electrodes 200 corresponds to the number of second via holes 195*b*, that is, at least one N-type electrode 210 may be provided.

In the aforementioned LED chip according to the embodiment of the present invention, the P-type electrode 210 and N-type electrode 200 are formed by burying the conductive material in the at least one first via hole 195*a* and second via hole 195*b* with the intaglio pattern 196, to thereby increase the surface area of the P-type electrode 210 and N-type electrode 200.

The P-type electrode 210 and N-type electrode 200 are respectively formed in the shapes corresponding to the first and second via holes 195*a* and 195*b*. Thus, the current injection property of the LED chip can be improved by increasing the surface area of the P-type electrode 210 and N-type electrode 200.

After cutting the respective hybrid LED chips completely manufactured, the cut hybrid LED chips are mounted on the substrate in the package type through the Surface Mount Devices (SMD) technology, to thereby realize the LED device according to the embodiment of the present invention.

According to another embodiment of the present invention, the LED chips may be coated with fluorescent material and epoxy without cutting the respective hybrid LED chips, and the micro-lens may be formed thereon, to thereby realize the LED device emitting the white-colored light.

The method of manufacturing the hybrid LED chip according to the embodiment of the present invention can improve the manufacturing efficiency by omitting the process of forming the bonding wire.

The hybrid LED chip manufactured by the aforementioned method according to the embodiment of the present invention and the LED device including the same enable to supply the driving power source without the bonding wire, to thereby improve the reliability and quality of the LED device.

Accordingly, the hybrid LED chip according to the embodiment of the present invention can improve the optical efficiency by enhancing the current injection property.

Also, the hybrid LED chip according to the embodiment of the present invention enables to supply the driving power source to the electrode without the bonding wire, to thereby prevent the reliability and quality of the LED device from being deteriorated by the defective connection of the bonding wire.

In the hybrid LED chip according to the embodiment of the present invention and the LED device including the same, the surface-roughness process is applied to the surface of the second clad layer 120 so that the upper surface of the second clad layer 120, from which the sapphire substrate 110 is removed, becomes uneven. Thus, the heat dissipation property is enhanced so that the reliability of the LED device is improved.

The method for manufacturing the hybrid LED chip according to the embodiment of the present invention can improve the manufacturing efficiency of the LED chip by omitting the wire bonding process.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A hybrid LED chip, comprising:
a first clad layer of P-type semiconductor material;
a second clad layer of N-type semiconductor material;
an active layer between the first and second clad layers;
a first bonding metal layer on the first clad layer;
a second bonding metal layer on the second clad layer;
a ceramic substrate positioned on and bonded to the first and second bonding metal layers, the ceramic substrate including:
at least one first via hole configured to expose the first bonding metal layer; and
at least one second via hole configured to expose the second bonding metal layer;
a P-type electrode formed by burying a conductive material in the at least one first via hole;
an N-type electrode formed by burying a conductive material in the at least one second via hole;
an electrode pad configured to connect the second clad layer with the N-type electrode; and
an insulating layer configured to insulate the first bonding metal layer and the second bonding metal layer,
wherein the first and second via holes in the ceramic substrate are formed in cylindrical shapes,
wherein the circumferential surface of each cylindrical shape is provided with an intaglio pattern, and
wherein the first bonding metal layer is configured to connect the first clad layer with the P-type electrode.

2. The hybrid LED chip according to claim 1,
wherein the intaglio pattern is repeatedly formed along the circumference in each of the first and second via holes, and the length of each intaglio pattern is arranged in a longitudinal direction in each of the first and second via holes; and
wherein the intaglio pattern is formed with the plurality of triangular-shaped cross sections, trapezoidal-shaped cross sections, saw-tooth shaped cross sections, or elliptical-shaped cross sections at one side of the circumference.

3. The hybrid LED chip according to claim 1, wherein each of the P-type electrode and N-type electrode is formed to have a relief pattern corresponding to the intaglio pattern in each of the first and second via holes.

4. The hybrid LED chip according to claim 1, wherein the P-type electrode and N-type electrode are formed in cylindrical shapes, and the circumferential surface of each cylindrical shape is provided with a relief pattern having the plurality of triangular-shaped cross sections, trapezoidal-shaped cross sections, saw-tooth shaped cross sections, or elliptical-shaped cross sections at one side of the circumferential surface.

5. The hybrid LED chip according to claim 1, wherein the number of P-type electrodes corresponds to the number of at least one first via hole, and the number of N-type electrodes corresponds to the number of at least one second via hole.

6. The hybrid LED chip according to claim 1, further comprising a reflective layer of a light-reflecting material between the first clad layer and the first bonding metal layer.

7. The hybrid LED chip according to claim 1, wherein the electrode pad is disposed between the second clad layer and the second bonding metal layer.

8. The hybrid LED chip according to claim 1, wherein the second clad layer has an uneven upper surface with both intaglio and relief patterns.

9. The hybrid LED chip according to claim 1, wherein the ceramic substrate is formed of AlN material.

10. An LED device, comprising:
a hybrid LED chip, including:
a first clad layer of P-type semiconductor material;
a second clad layer of N-type semiconductor material;
an active layer between the first and second clad layers;
a first bonding metal layer on the first clad layer;
a second bonding metal layer on the second clad layer;
a ceramic substrate positioned on and bonded to the first and second bonding metal layers, the ceramic substrate including:
at least one first via hole to expose the first bonding metal layer; and
at least one second via hole to expose the second bonding metal layer;
a P-type electrode formed by burying a conductive material in the at least one first via hole; and
an N-type electrode formed by burying a conductive material in the at least one second via hole;
an electrode pad configured to connect the second clad layer with the N-type electrode; and
an insulating layer configured to insulate the first bonding metal layer and the second bonding metal layer,
wherein the first bonding metal layer is configured to connect the first clad layer with the P-type electrode;
a fluorescent layer on the hybrid LED chip; and
a micro-lens on the fluorescent layer,
wherein the first and second via holes in the ceramic substrate are formed in cylindrical shapes, and
wherein the circumferential surface of each cylindrical shape is provided with an intaglio pattern.

11. The LED device according to claim 10,
wherein the intaglio pattern is repeatedly formed along the circumference in each of the first and second via holes, and the length of each intaglio pattern is arranged in a longitudinal direction in each of the first and second via holes, and the intaglio pattern is formed with the plurality of triangular-shaped cross sections, trapezoidal-shaped cross sections, saw-tooth shaped cross sections, or elliptical-shaped cross sections at one side of the circumference; and
wherein each of the P-type electrode and N-type electrode is formed to have a relief pattern corresponding to the intaglio pattern in each of the first and second via holes.

* * * * *